(12) United States Patent
Deguenther

(10) Patent No.: US 9,665,010 B2
(45) Date of Patent: May 30, 2017

(54) METHOD FOR OPERATING A MICROLITHOGRAPHIC PROJECTION EXPOSURE APPARATUS

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 232 days.

(21) Appl. No.: 14/594,670

(22) Filed: Jan. 12, 2015

(65) Prior Publication Data

US 2015/0153650 A1 Jun. 4, 2015

Related U.S. Application Data

(63) Continuation of application No. PCT/EP2013/002243, filed on Jul. 29, 2013.
(Continued)

(30) Foreign Application Priority Data

Aug. 1, 2012 (DE) .................. 10 2012 213 515

(51) Int. Cl.
*G03F 7/20* (2006.01)
*G02B 26/08* (2006.01)
*G02B 19/00* (2006.01)

(52) U.S. Cl.
CPC ......... *G03F 7/702* (2013.01); *G02B 19/0095* (2013.01); *G02B 26/0833* (2013.01);
(Continued)

(58) Field of Classification Search
None
See application file for complete search history.

(56) References Cited

U.S. PATENT DOCUMENTS

2007/0146853 A1 6/2007 Singer et al.
2007/0148561 A1* 6/2007 Nam ................ B82Y 10/00
430/5
(Continued)

FOREIGN PATENT DOCUMENTS

DE 10 2009 045 694 A1 4/2011
NL WO 2011080019 A1 * 7/2011 .......... G03F 7/70116
WO WO 2009/100856 8/2009

OTHER PUBLICATIONS

International Search Report for corresponding PCT Appl No. PCT/EP2013/002243, dated Dec. 20, 2013.

*Primary Examiner* — Steven H Whitesell Gordon
(74) *Attorney, Agent, or Firm* — Fish & Richardson P.C.

(57) ABSTRACT

In a method for operating a microlithographic projection exposure apparatus, a facet mirror is illuminated with projection light having a center wavelength of between 5 nm and 30 nm. The facet mirror has a plurality of adjustable mirror facets, wherein groups of adjacent mirror facets form regions which are imaged by an optical unit onto an object plane of a projection objective of the projection exposure apparatus. There the images of the regions are superimposed in an object field. An illumination field, which is identical to the object field or a part thereof, is illuminated with the projection light. A mask containing structures to be imaged is moved in the object plane of the projection objective in such a way that the illumination field scans over the mask. According to the invention, during step c) the size of the illumination field is varied by adjusting at least one mirror facet.

23 Claims, 10 Drawing Sheets

Related U.S. Application Data

(60) Provisional application No. 61/678,195, filed on Aug. 1, 2012.

(52) U.S. Cl.
CPC ...... *G03F 7/70066* (2013.01); *G03F 7/70075* (2013.01); *G03F 7/70116* (2013.01); *G03F 7/70233* (2013.01)

(56) References Cited

U.S. PATENT DOCUMENTS

| | | |
|---|---|---|
| 2007/0259275 A1 | 11/2007 | Van Herpen et al. |
| 2008/0111983 A1 | 5/2008 | Singer et al. |
| 2011/0001947 A1 | 1/2011 | Dinger et al. |
| 2011/0085151 A1 | 4/2011 | Deguenther |

\* cited by examiner

METHOD FOR OPERATING A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2013/002243, filed Jul. 29, 2013, which claims benefit under 35 USC 119 of US provisional application Ser. No. 61/678,195 filed Aug. 1, 2012 and of German patent application 10 2012 213 515.4 filed Aug. 1, 2012. The full disclosure of each of these patent applications is incorporated herein by reference.

BACKGROUND OF THE INVENTION

1. Field of the Invention

The invention relates to a method for operating a microlithographic projection exposure apparatus designed for wavelengths in the extreme ultraviolet spectral range (EUV). The invention furthermore relates to a microlithographic projection exposure apparatus suitable for carrying out the method.

2. Description of the Prior Art

Microlithographic projection exposure apparatuses are used to transfer structures contained in a mask or arranged thereon to a photoresist or some other light-sensitive layer. The most important optical components of a projection exposure apparatus are a light source, an illuminating system, which conditions the projection light generated by the light source and directs it onto the mask, and a projection objective, which images that region of the mask which is illuminated by the illumination system onto the light-sensitive layer.

The shorter the wavelength of the projection light, the smaller the structures that can be produced on the light-sensitive layer with the aid of the projection exposure apparatus. The most recent generation of projection exposure apparatuses uses projection light having a center wavelength of approximately 13.5 nm, which is therefore in the extreme ultraviolet spectral range (EUV). Such apparatuses are often referred to as EUV projection exposure apparatuses.

However, there are no optical materials which have a sufficiently high transmissivity for such short wavelengths. Therefore, in EUV projection exposure apparatuses the lenses and other refractive optical elements that are customary at longer wavelengths are replaced by mirrors, and the mask, too, therefore contains a pattern of reflective structures.

The provision of mirrors for EUV projection exposure apparatuses constitutes a major technological challenge. Coatings which are suitable for EUV light and are applied to a mirror substrate often comprise more than 30 or 40 double layers having a thickness of just a few nanometers, which are vapor-deposited one above another in technologically complex processes. Even with coatings of such complex construction, the reflectivity of the mirrors for the EUV light is usually hardly more than 70%, and even this applies only to light that impinges on the reflective coating perpendicularly or with angles of incidence of a few degrees.

The comparatively low reflectivity of the mirrors has the consequence that in the development of EUV projection exposure apparatuses efforts have to be made to use as few mirrors as possible, since each mirror involves light losses and ultimately reduces the throughput of the projection exposure apparatus.

For the illumination system of such apparatuses this means, inter alia, that it is not possible to use an optical unit to image an adjustable field stop onto the mask, as is the case with illumination systems for longer wavelengths around the DUV or VUV spectral range. Such adjustable field stops contain moveable stop elements, which are occasionally also designated as reticle masking blades. Owing to an imaging optical unit being dispensed with in this way, in EUV projection exposure apparatuses the field stop is arranged as near as possible to the mask.

However, an arrangement of the field stop in direct proximity to the mask is associated with a number of disadvantages. In this regard, owing to the small but nevertheless finite distance between the field stop and the mask, it turns out that the edges of the illumination field illuminated on the mask are not sharp. Moreover, an (albeit small) part of the light reflected and diffracted at the mask is shaded by the field stop.

A further problem that arises as a result of the arrangement of the field stop in direct proximity to the mask is associated with the fact that the reticle masking blades are moved at high speed and high acceleration during the scanning process. The reticle masking blades ensure that the dimensions of the illumination field along the scanning direction are continuously increased at the beginning of the scanning process and are reduced again at the end of the scanning process. The rapid and frequent travel movements of the reticle masking blades foster the production of tiny abraded particles. However, since the abraded particles are released in direct proximity to the mask, they can be imaged onto the light-sensitive layer, which can lead to defects in the lithographically produced components.

SUMMARY OF THE INVENTION

Therefore, it is an object of the invention to specify a method for operating a microlithographic projection exposure apparatus in which the problems associated with the use of adjustable field stops do not occur.

The object is achieved via a method for operating a microlithographic projection exposure apparatus comprising the following steps:

a) illuminating a facet mirror with projection light having a center wavelength of between 5 nm and 30 nm, wherein the facet mirror comprises a plurality of adjustable mirror facets, and wherein groups of adjacent mirror facets form regions which are imaged by an optical unit onto an object plane of a projection objective of the projection exposure apparatus in such a way that in the object plane the images of the regions are superimposed in an object field;

b) illuminating an illumination field with projection light, wherein the illumination field is identical to the object field or to a part thereof;

c) moving a mask, containing structures to be imaged, in the object plane of the projection objective in such a way that the illumination field scans over the mask;

d) during step c) varying the size of the illumination field by adjusting at least one mirror facet.

The fact that the size of the illumination field is varied by adjusting the facet mirrors means that there is no need for an adjustable field stop which is arranged in direct proximity to the mask and with which the size of the illumination field is varied in conventional EUV projection exposure apparatuses. As a result, the above-explained problems that are caused by such adjustable field stops cannot occur.

Under certain circumstances it may be expedient, however, to use the method also in the case of such projection exposure apparatuses in which a non-adjustable field stop is arranged in direct proximity of the mask. As a result, at least the outlay for the adjustability of the field stop is obviated, and the risk of disturbances caused by abraded particles is also considerably reduced owing to the lack of travel movements.

The adjustability of the mirror facets can be restricted, for example, to a variation of the reflection coefficient of their reflective coating. Selected mirror facets then lose their reflectivity, for instance by an electrical voltage being applied, if the size of the illuminated object field is intended to be reduced.

In general, however, it will be simpler and more effective if the position, i.e. the spatial arrangement, of the at least one mirror facet is varied in order to vary the size of the illumination field. In step d) the at least one mirror facet is then transferred from an inactive position to an active position, or vice versa, wherein the at least one mirror facet in the active position directs projection light onto the object field and in the inactive position cannot direct projection light onto the object field.

In this case, there can indeed be more than one active and/or inactive position. Particularly when the illumination angle distribution in the object plane is defined by the adjustable mirror facets, there will be at least a plurality of active positions for each mirror facet.

Different positions can be assumed in particular by mirror facets which are tiltable about at least one axis, and preferably about two orthogonal axes, with the aid of actuators. Examples of facet mirrors having such tiltable mirror facets, which are likewise imaged onto the object plane regionally by a downstream optical unit, such that the images of the regions are superimposed in the object plane, are described in WO 2009/100856 A1 and DE 10 2009 045 694 A1.

In order to enlarge the illumination field at the beginning of a scanning process, the at least one mirror facet can be transferred from the inactive position to the active position while the mask is moved in step c). At the end of a scanning process, the illumination field is reduced by the at least one mirror facet being transferred from the active position to the inactive position while the mask is moved in step c).

In order to vary the size of the illumination field along a scanning direction of the projection exposure apparatus during a scanning process, it is expedient if a plurality of mirror facets are adjusted in a plurality of regions, and preferably in all regions, and even more preferably simultaneously. This ensures that at least perpendicularly to the scanning direction the intensity distribution within the illumination field remains unchanged independently of the size thereof.

At the beginning of the scanning process, during step c) the illumination field is preferably enlarged by successively adjusting at least one mirror facet until the illumination field has its maximum size.

If the mask is moved along a scanning direction in step c), exclusively the size of the illumination field along the scanning direction will generally be varied in step d). In principle, however, it is also possible to vary the size of the illumination field in a transverse direction perpendicular to the scanning direction. This is appropriate, for example, when relatively large regions on the mask contain no structures to be imaged and the thermal loading of the mask as a result of the absorption of projection light is intended to be reduced by the reduction of the illumination field perpendicularly to the scanning direction.

The invention furthermore relates to a microlithographic projection exposure apparatus suitable for carrying out the method according to the invention. The apparatus comprises:

a) a light source, which is configured to generate projection light having a center wavelength of between 5 nm and 30 nm, b) a facet mirror, wherein
the facet mirror comprises a plurality of adjustable mirror facets, and wherein
groups of adjacent mirror facets form regions which are imaged by a downstream optical unit onto an object plane of a projection objective of the projection exposure apparatus in such a way that in the object plane the images of the regions are superimposed in an object field, c) a moving device configured to moving a mask, which contains structures to be imaged, in the object plane of the projection objective in such a way that an illumination field, which is illuminated by the projection light and is identical to the object field or to a part thereof, scans over the mask, d) a control device configured to control the mirror facets, wherein the control device is programmed in such a way that during the moving of the mask, the size of the illumination group is varied by adjusting at least one mirror face.

In one embodiment the mask carries a first and a second absorbent layer, which both extend perpendicularly to a scanning direction, along which the mask is moved, across the entire length of the object field. The first absorbent layer is arranged in the scanning direction in front of and the second absorbent layer in the scanning direction behind the structures to be imaged. Since, owing to the finite number of mirror facets, arbitrarily narrow object fields cannot be generated, the two absorbent layers in front of and behind the structures to be imaged ensure that, in the case of object field widths varying in a step-by-step manner, no projection light is incident on regions of the mask which contain no structures to be imaged. If such regions were likewise illuminated, then they would likewise be imaged onto the light-sensitive layer and contribute there to a reduction in contrast.

BRIEF DESCRIPTION OF THE DRAWINGS

Further features and advantages of the invention are evident from the following description of preferred embodiments with reference to the drawings, in which.

DESCRIPTION OF PREFERRED EMBODIMENTS

1. Basic Construction of the Projection Exposure Apparatus

Figure 1:
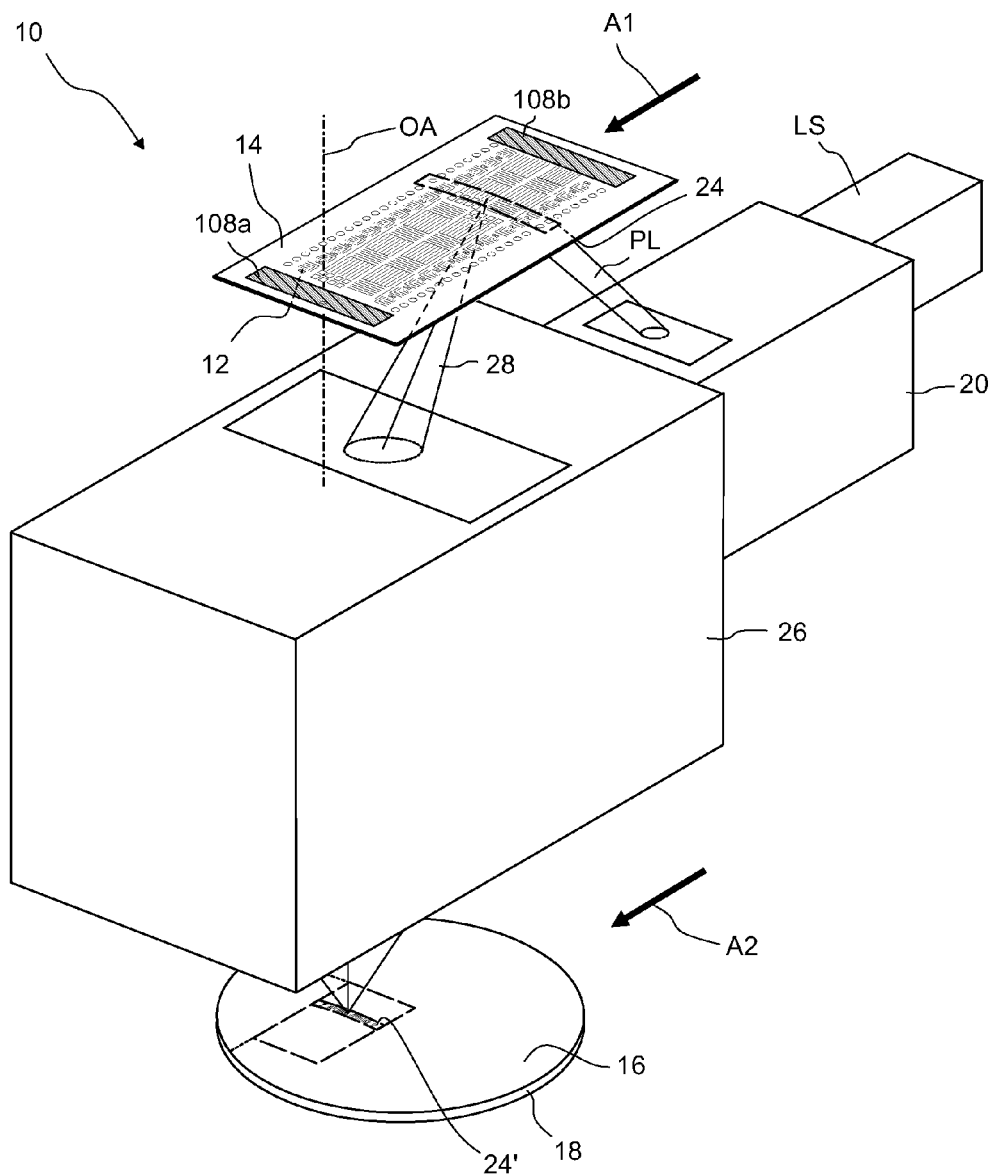
FIG. 1 shows a perspective view of an EUV projection exposure apparatus according to the invention in accordance with an embodiment of the invention.

FIG. 1 shows, in a perspective and highly schematic illustration, the basic construction of a microlithographic projection exposure apparatus according to the invention, the apparatus being designated in its entirety by 10. The projection exposure apparatus 10 serves to project reflective structures 12 arranged on the underside of a mask 14 onto a light-sensitive layer 16. The light-sensitive layer 16, which can be, in particular, a photoresist (also called resist), is carried by a wafer 18 or some other substrate.

The projection exposure apparatus 10 comprises a light source LS, which generates projection light PL and can be embodied as a plasma source, for example. A range of between 5 nm and 30 nm, in particular, is appropriate as center wavelength for the projection light PL, the range being part of the extreme ultraviolet spectrum (EUV). In the embodiment illustrated, the center wavelength of the projection light PL is 13.5 nm.

An illumination system 20 directs the projection light PL into the underside of the mask 14 provided with the structures 12. In this case, the projection light PL illuminates an illumination field 24 on the underside of the mask 14, the illumination field having the geometry of a ring segment in the embodiment illustrated.

The projection exposure apparatus 10 furthermore comprises a projection objective 26, which generates on the light-sensitive layer 16 a reduced image 24' of the structures 12 lying in the region of the illumination field 24. OA denotes the optical axis of the projection objective 26, which coincides with the axis of symmetry of the ring-segment-shaped illumination field 24. However, the invention can also be used in those projection exposure apparatuses in which no rotationally symmetrical optical surfaces are present in the projection objective 26 and an optical axis is therefore not defined.

The projection exposure apparatus 10 is designed for a scanning operation in which the mask 14 is moved synchronously with the wafer 18 during the exposure of the light-sensitive layer 16. These travel movements of the mask 14 and of the wafer 18 are indicated by arrows A1 and A2, respectively, in FIG. 1; the moving devices necessary for moving the mask 14 and the wafer 18 are not illustrated for the sake of clarity. The ratio of the speeds at which the mask 14 and the wafer 18 are moved is in this case equal to the imaging scale □ of the projection objective 26. In the embodiment illustrated, the image 24' generated by the projection objective 20 is reduced ($|\beta|<1$) and erect ($\beta>0$), for which reason the wafer 18 is moved more slowly than the mask 14, but along the same direction. During an exposure of the light-sensitive layer 16, therefore, the illumination field 24 scans over the mask 14 so that even relatively large structure regions can be projected continuously onto the light-sensitive layer 16.

Light beams proceed from each point in the illumination field 24 which is situated in an object plane of the projection objective 26, the light beams entering into the projection objective 26. The latter has the effect that the entering light beams converge in an image plane behind the projection objective 26 at field points. The field points in the object plane from which the light beams proceed, and the field points in the image plane at which the light beams converge again are thus optically conjugate with respect to one another.

For an individual point in the center of the illumination field 24, such a light beam is indicated schematically and designated by 28. In this case, the aperture angle of the light beam 28 upon entering into the projection objective 26 is a measure of the object-side numerical aperture $NA_o$ thereof. On account of the reduced imaging, the image-side numerical aperture $NA_i$ of the projection objective 26 is enlarged by the reciprocal of the imaging scale $\beta$.

Figures 2, 3:
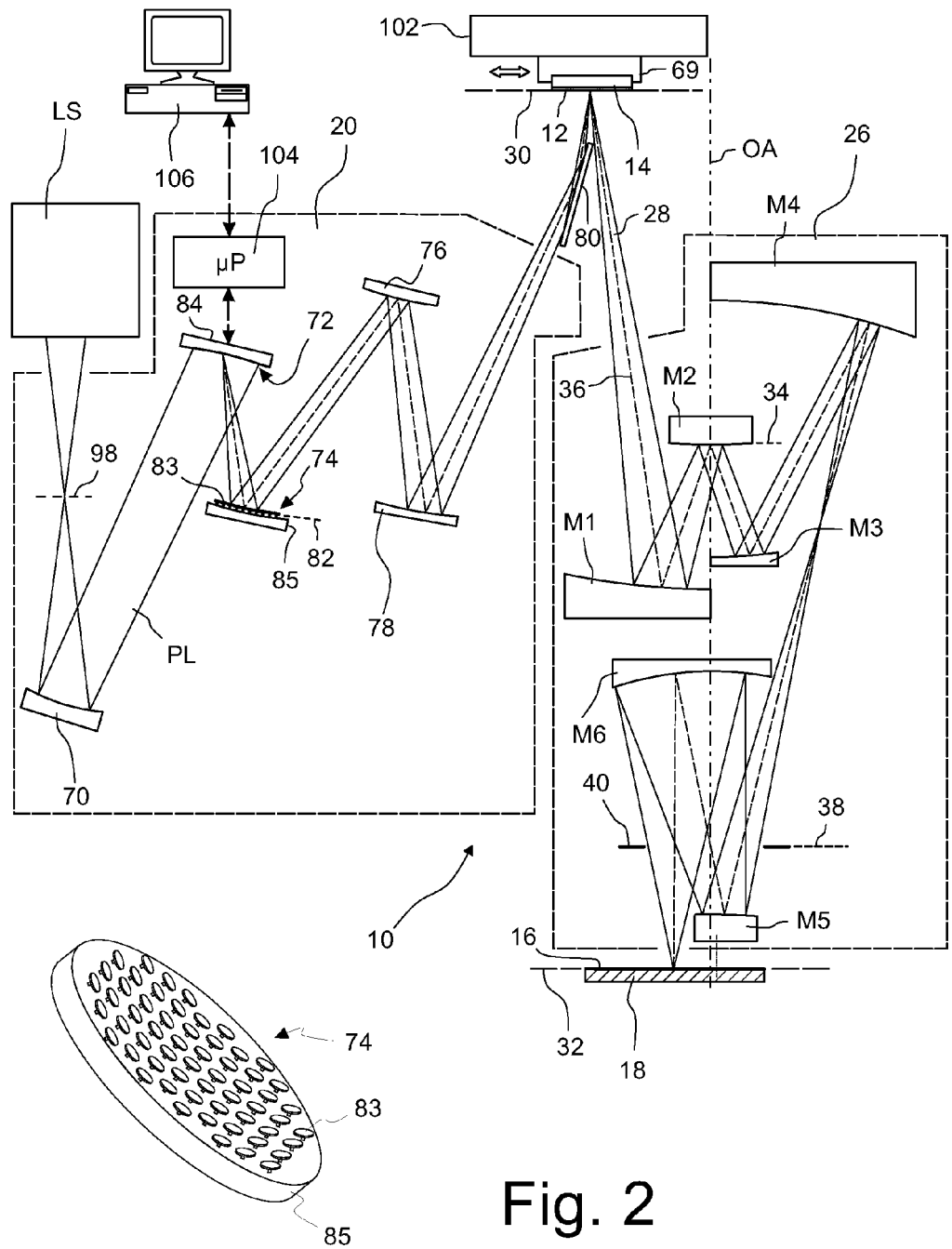
FIG. 2 shows a meridional section through the projection exposure apparatus shown in FIG. 1.
FIG. 3 shows a perspective view of a pupil facet mirror that is part of an illumination system of the projection exposure apparatus shown in FIGS. 1 and 2.

FIG. 2 shows a schematic meridional section through the projection exposure apparatus 10 in which further details can be discerned. Between the object plane—designated by 30—and the image plane—designated by 32—of the projection objective 26, a total of six mirrors M1 to M6 are arranged. The light beam 28 proceeding from a point in the object plane 30 firstly impinges on a concave first mirror M1, is reflected back onto a convex second mirror M2, impinges on a concave third mirror M3, is reflected back onto a concave fourth mirror M4 and then impinges on a convex fifth mirror M5 which directs the EUV light back onto a concave sixth mirror M6. The latter finally focuses the light beam 28 into a conjugate image point in the image plane 32.

The projection objective 26 has a first pupil surface 34, which is situated in or in direct proximity to the surface of the second mirror M2. A pupil surface is distinguished by the fact that there the chief rays of the light beam proceeding from points in the object plane 30 intersect the optical axis OA. This is shown in FIG. 2 for the chief ray of the light beam 28, the chief ray being designated by 36 and indicated in a dashed fashion.

A second pupil surface 38 is situated in the beam path between the fifth mirror M5 and the sixth mirror M6, wherein the distance from the second pupil surface 38 to these two mirrors M5, M6 is relatively large. An aperture stop 40 is arranged at the level of the second pupil surface 38.

The illumination system 20 of the projection exposure apparatus 10 conditions the projection light PL generated by the light source LS and directs it onto the mask 14, which is fixed to a mask holder 69, such that there every point within the illumination field 24 is illuminated with projection light PL having the desired intensity and illumination angle distribution. The term illumination angle distribution describes how the total intensity of a light beam assigned to a field point is distributed among the different directions of incidence.

For this purpose, the illumination system 20 has an input mirror 70, a field facet mirror 72, a pupil facet mirror 74, a first condenser mirror 76 and a second condenser mirror 78. Via a mirror 80 designed for grazing incidence which mirror can also be arranged within the illumination system 20, the projection light PL is finally directed onto the mask 14.

The pupil facet mirror 74 illustrated in perspective view in FIG. 3 is in this case arranged in a pupil surface of the illumination system 20, the pupil surface being indicated at 82, and comprises a multiplicity of pupil mirror facets 83 arranged on a carrier 85. Each pupil mirror facet 83 partly or even completely images the field facet mirror 72 onto the object plane 30, where the images of the field facet mirror 72 or parts thereof are thus superimposed.

The pupil surface 82 of the illumination system 20 is optically conjugate with respect to the pupil surfaces 34 and 38 of the projection objective 26. This means that the intensity distribution on the pupil facet mirror 74 of the illumination system 20 is imaged firstly onto the second mirror M2 of the projection objective 26 and from there onto the second pupil surface 38.

Since the pupil surface 82 of the illumination system 20 is linked to the object plane 30 by a Fourier transformation, the illumination angle distribution in the object plane 30 is defined by the spatial intensity distribution in the pupil surface 82. Therefore, locations in the pupil surface 82 correspond to angles in the object plane 30. Conversely, angles in the pupil surface 82 correspond to locations in the object plane 30. By virtue of the generation of different intensity distributions on the pupil facet mirror 74 with the aid of the field facet mirror 72, the illumination angle distribution of the projection light PL impinging on the mask 14 can be adapted in a targeted manner to the structures 12 contained in the mask 14.

2. Field Facet Mirror

The construction and the function of the field facet mirror 72 are explained in greater detail below with reference to FIGS. 4 to 10.

Figure 4:
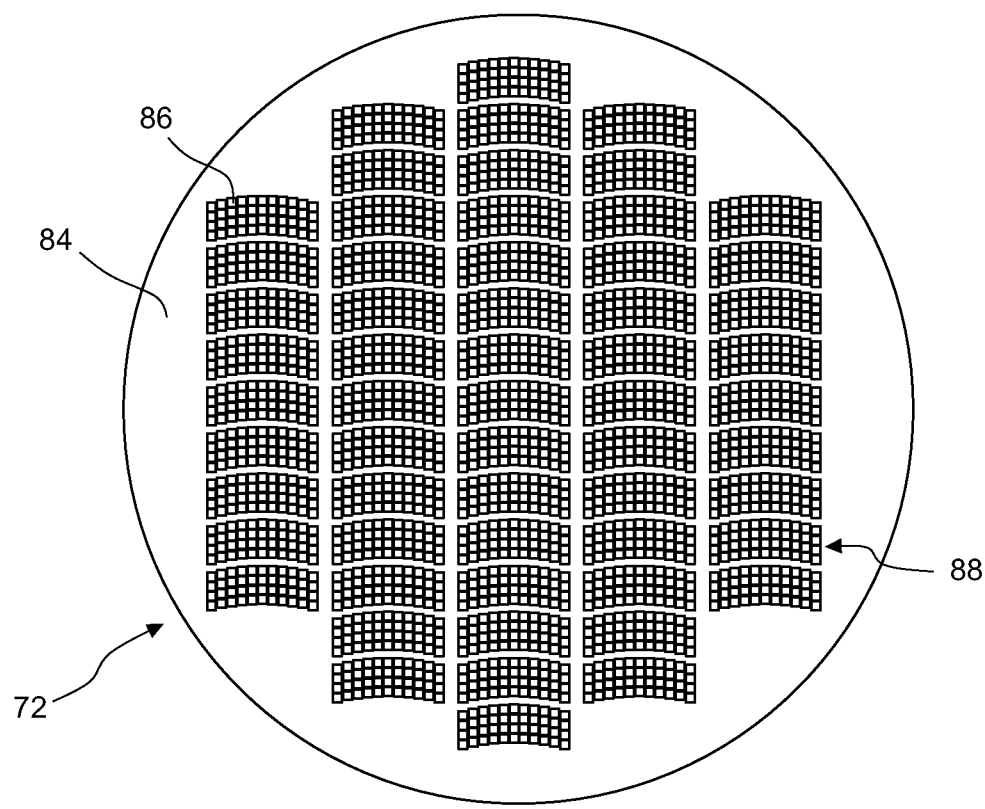
FIG. 4 shows a plan view of a field facet mirror that is likewise part of the illumination system.

FIG. 4 shows the field facet mirror 72 in a plan view. The field facet mirror 72 comprises a carrier 84 which carries a multiplicity of small mirror facets 86. Groups of adjacent mirror facets 86 form on the carrier 84 regions whose contour (apart from a scale factor), corresponds to the geometry of the illumination field 24 illuminated on the mask 14 by the illumination system 20 if the illumination field has its maximum size.

Figure 5:
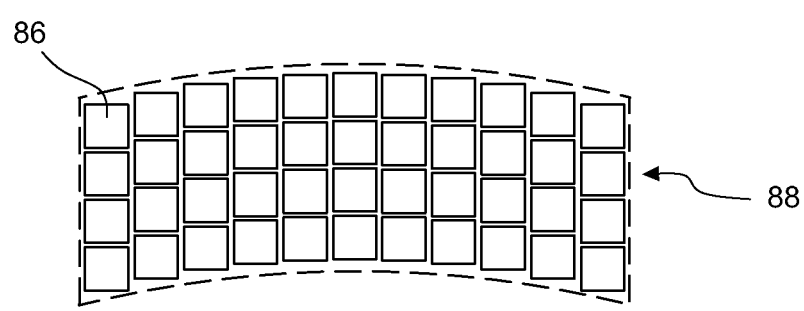
FIG. 5 shows an enlarged excerpt from FIG. 4.

FIG. 5 shows such a group of mirror facets 86 in an enlarged illustration. The approximate contour of the region 88 formed by this group is indicated by a dashed line. In the embodiment illustrated, the group forming the region 88 comprises four rows each having eleven mirror facets 86.

In the embodiment illustrated, a total of fifty-nine regions 88 are arranged on the carrier 84 of the field facet mirror 72, with the result that the total number of mirror facets 86 is approximately 2600. However, the number of mirror facets 86 can also be significantly higher and be, in particular of the order of magnitude of between $10^5$ and $10^6$.

Figure 6:
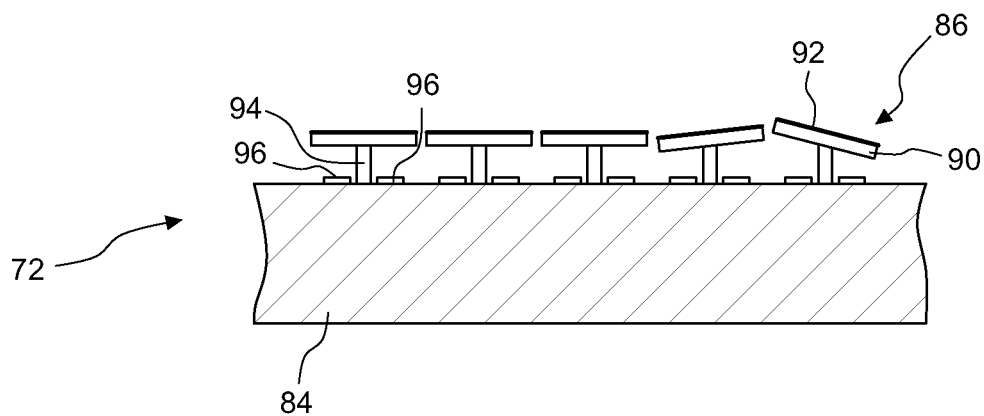
FIG. 6 shows a cross section through a part of the field facet mirror shown in FIGS. 4 and 5.

As shown by the schematic sectional view in accordance with FIG. 6 through a part of the field facet mirror 72, the mirror facets 86 are individually adjustable. In FIG. 6, the two mirror facets 86 illustrated on the right are tilted about an axis perpendicular to the plane of the drawing, while the remaining mirror facets are in their zero position. Each mirror facet 86 comprises a substrate 90 carrying a reflective coating 92. The reflective coating 92 is designed to reflect the projection light PL generated by the light source LS. The mirror facet 86 is connected to a post 94 via a flexure (not illustrated in greater detail) the post in turn being carried by the carrier 84 of the field facet mirror 72.

Actuators 96 are arranged on that surface of the carrier 84 which faces the mirror facets 86, the actuators enabling the mirror facets 86 to be tilted about two orthogonal tilting axes individually and continuously over a predefined angular range. In the embodiment illustrated, the actuators 96 are embodied as electrodes that can exert electrostatic forces on the substrates 90 of the mirror facets 86. It goes without saying that other types of actuators 96 are also appropriate, provided that they enable a sufficient miniaturization of the mirror facets 86. The arrangement of the mirror facets 86 as shown in FIGS. 4 to 6 can be realized for example using MEMS technology (micro-electro-mechanical system), as is known per se in the prior art.

Each region 88 is imaged by the downstream optical unit onto the object plane 30 of the projection objective 26 in such a way that in the object plane 30 the images of the regions 88 are superimposed in an object field 88'. The object field 88' is therefore a region in the object plane 30 which can be illuminated by projection light PL. The part of the object field 88' which is illuminated and forms the illumination field 24 depends on which mirror facets 86 in the regions 88 direct projection light PL onto the pupil facet mirror 74 such that it finally reaches the object plane 30.

Figure 7:
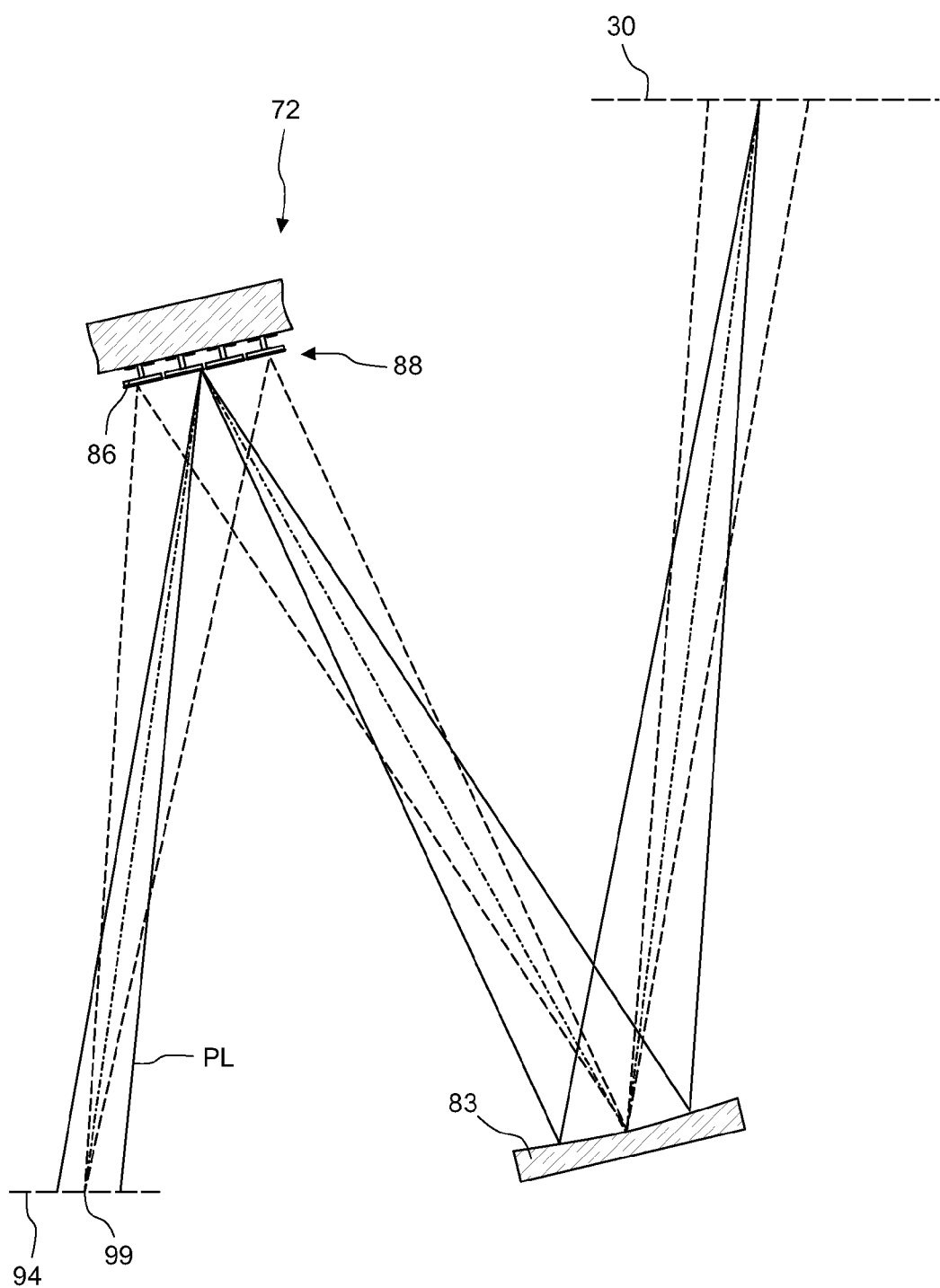
FIG. 7 shows a highly schematically illustrated beam path in the illumination system of the projection exposure apparatus shown in FIGS. 1 and 2.

This is explained below with reference to FIG. 7, which shows a simplified excerpt from the illumination system 20. The mirrors 76, 78 and 80 between the pupil facet mirror 74 and the object plane 30, the mirrors only being optional anyway, are not illustrated in FIG. 7 for the sake of simplicity; moreover, only a single region 88 of the field facet mirror 72 is indicated, and only a single pupil mirror facet 83 of the pupil facet mirror 74 is indicated.

As can be gathered from the beam path, the region 88 directs impinging projection light onto one of the pupil mirror facets 83 of the pupil facet mirror 74. The region 88 is imaged onto the object plane 30 completely by the pupil facet mirror 83 and the downstream optical unit (not illustrated). An image of the four mirror facets 86 of the region 88 which are discernible in FIG. 7 thus arises there. This image defines the object field 88' which can be maximally illuminated in the object plane 30. In this case, the direction from which the projection light PL impinges on the object plane 30 is defined by the selection of the pupil facet mirror 83 onto which the mirror facets 86 of the region 88 direct the projection light. This assignment is generally variable in order to be able to set different illumination angle distributions in the object plane 30.

The beam path indicated in a dashed fashion illustrates that the region 88, for its part, images the intermediate focus 99, which is indicated in an intermediate focal plane 98 and is generated by the light source LS, onto the pupil mirror facet 83 of the pupil facet mirror 74.

The same correspondingly also applies to the remaining regions 88 of the field facet mirror 72. Each region 88 is thus imaged onto the object plane 30 by a pupil mirror facet 83 of the pupil facet mirror 74 and, if appropriate, further mirrors present, to be precise in such a way that the images of all the regions 88 are superimposed as far as possible completely in the object field 88'. The object field 88' that can be illuminated in the object plane 30 thus represents a superimposition of images of the regions 88 of the field facet mirror 72. Since very many regions 88 contribute to this superimposition, the object field 88' can be illuminated uniformly and from different directions. The illumination angle distribution is defined by the assignment of regions 88 to the pupil mirror facets 83 of the pupil facet mirror 74, as has already been explained above. Each region 88 together with an assigned pupil mirror facet 83 thus forms an optical channel that directs the projection light PL generated by the light source LS onto the object field 88' from a specific direction.

Figure 8:
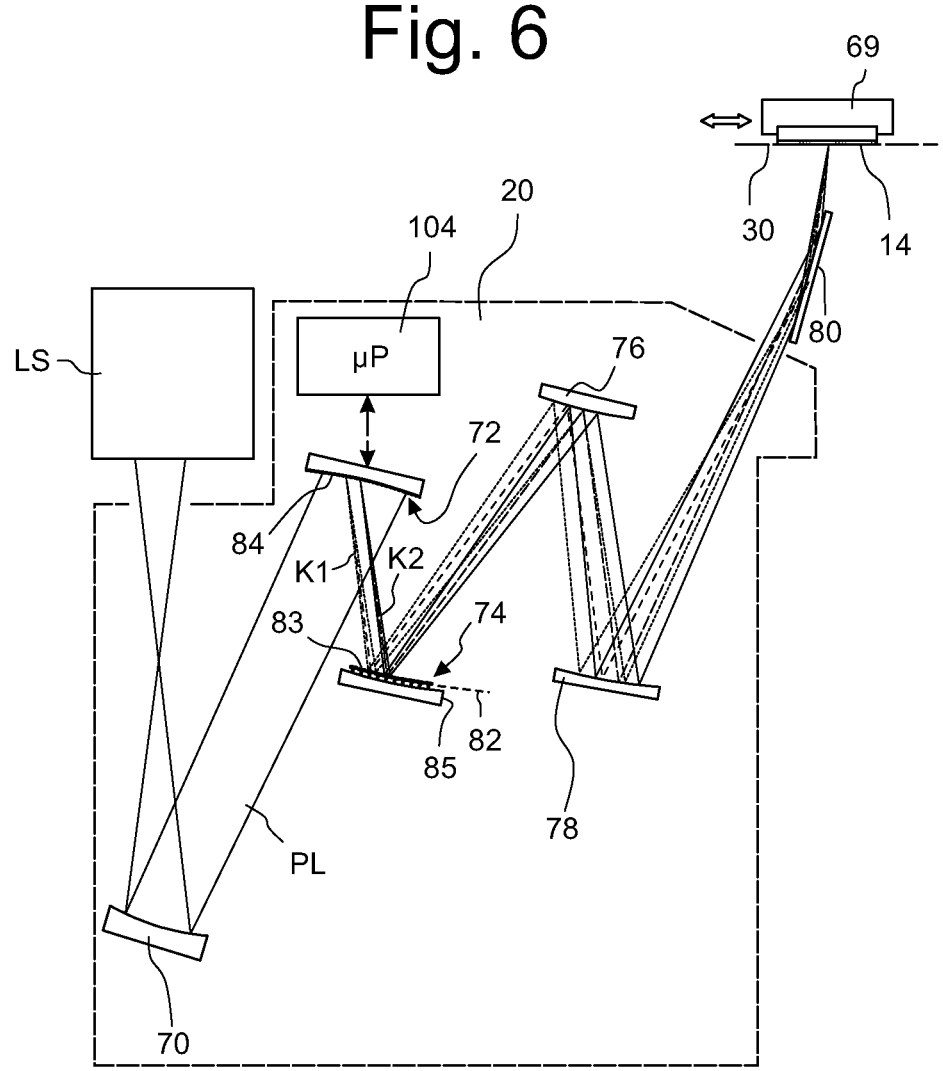
FIG. 8 shows a meridional section through the illumination system in accordance with FIG. 2, illustrating two optical channels.

This subdivision into individual channels is illustrated in FIG. 8, which is an excerpt from FIG. 2. Two of the channels are designated by K1, K2 in FIG. 8. It can be discerned from the beam path depicted that two points in different regions 88 of the field facet mirror 72 are imaged onto the same point in the object plane 30, but the point is illuminated from different directions.

Figure 9:
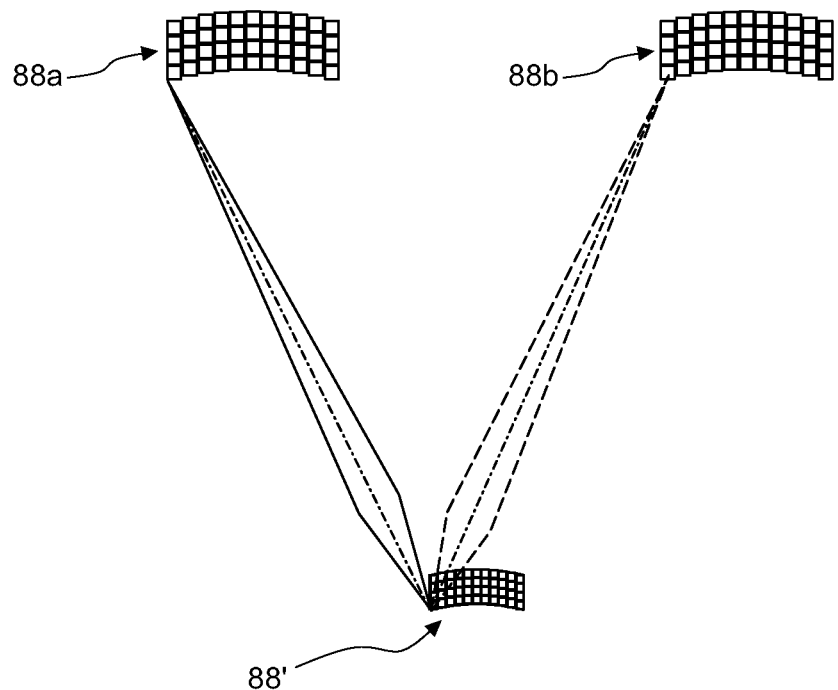
FIG. 9 shows a highly schematic illustration of how two regions of mirror facets of the field facet mirror are jointly imaged onto the object plane of the projection objective.

FIG. 9 shows the superimposition of the images of two regions 88a, 88b to form the object field 88' in another schematic illustration. Since in the embodiment illustrated, all regions 88 contain an identical arrangement of mirror facets 86, the object field 88' is likewise rastered. Since a rastering of the object field 88' perpendicularly to the scanning direction A1 is generally undesirable since it leads to the formation of dark lines along the scanning direction, it may be expedient if the arrangement of the mirror facets 86 in the regions 88 slightly differs from one another.

Further details concerning the field facet mirror 72 can be gathered from WO 2009/100856 and DE 10 2009 045 694 A1 already mentioned in the introduction.

The individual adjustability of the mirror facets 86 makes it possible to illuminate only parts of the object field 88' and thus to vary the size of the illumination field 24. If, in all regions 88, for example, individual mirror facets 86 at mutually corresponding positions are transferred to an inactive position, such that the relevant mirror facets 86 can no longer direct projection light PL onto the object field 88', then this leads to a variation of the dimensions of the illumination field 24.

Figure 10:
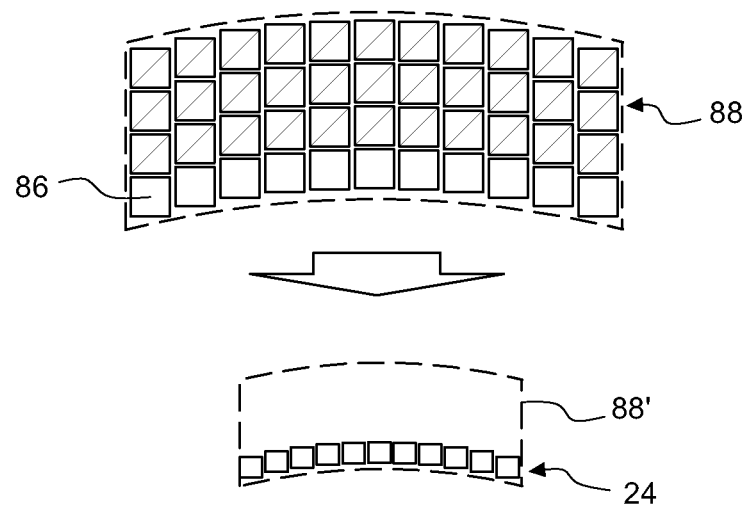
FIG. 10 shows a plan view of a region of mirror facets, wherein one row of mirror facets is in an active position and the remaining mirror facets are in an inactive position.

FIG. 10 illustrates this using a simple example. If, in all regions 88, the mirror facts 86 in the top three rows illustrated are transferred to an inactive position, which is indicated by a diagonal line in the mirror facets 86 in FIG. 10, then only the mirror facets 86 in the bottommost row remain in an active position in which they direct projection light onto the object field 88'. Consequently, rather than the entire object field 88' only a very narrow illumination field 24 is illuminated by the illumination system 20, as shown at the bottom in FIG. 10.

The following section explains how the variability of the size of the illumination field 24 can be used to make moveable masking stops superfluous. Such stops are necessary in conventional projection exposure apparatuses in order to cover parts of the mask 14 to be imaged at the beginning and at the end of each scanning process.

3. Variations of the Object Field Size During Scanning Process

FIGS. 11a to 11f show, schematically and not to scale, the function of the adjustable mirror facets 86 of the field facet mirror 72 during different points in time in the course of a scanning process in which a relatively large continuous region on the mask 14 is projected onto the light-sensitive layer 16. For reasons of clarity, only a single optical channel is shown, which is formed by a region 88 having a plurality of mirror facets 86 and a pupil mirror facet 83 of the pupil facet mirror 74. The explanations below correspondingly apply to the remaining optical channels.

Figure 11A:
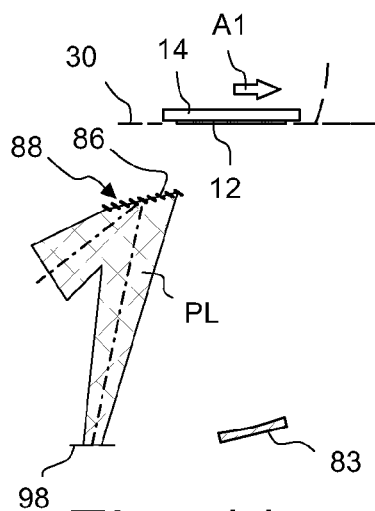
FIGS. 11*a* to 11*f* show a simplified excerpt from the illumination system at different points in time during a scanning process.
Figure 11B:
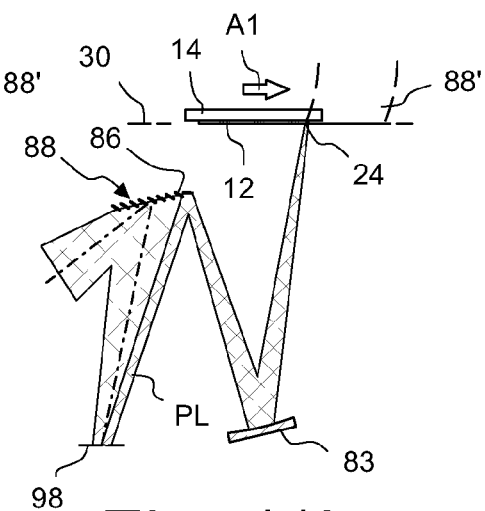

FIG. 11a illustrates the conditions at a point in time at which the mask 14 having the structures 12 to be imaged is still situated outside the object field 88', which, in FIGS. 11a to 11f, is mirrored upward and only half of it is indicated, using dashed lines. At this point in time, all mirror facets 86 of the region 88 are in an inactive position. This means that projection light PL coming from the intermediate focal plane 98 is reflected by the mirror facets 86 such that no projection light PL reaches the object field 88'.

If the mask 14 is moved further along the scanning direction—indicated by the arrow A1—with the aid of a moving device 102, only illustrated in FIG. 2, the front end of the mask 14 enters into the object field 88'. However, the illumination system 20 illuminates only that part of the object field 88' which forms the illumination field 24 and which covers the structures 12 on the mask 14. This is achieved by virtue of the fact that firstly only a single row of mirror facets 86 is transferred from the inactive position to an active position. The row is represented by the mirror facet 86 at the outer right edge in the sectional illustration in FIG. 11b.

This corresponds to the state illustrated in FIG. 10, except that instead of four a total of nine rows of mirror facets 86 are indicated in FIGS. 11a to 11f. At this point in time, therefore, the illumination field 24 is formed by a narrow strip, as is shown in FIG. 10. The illumination field 24 is arcuately curved and has a width equal to the width of the image of an individual mirror facet 86.

Figure 11C:
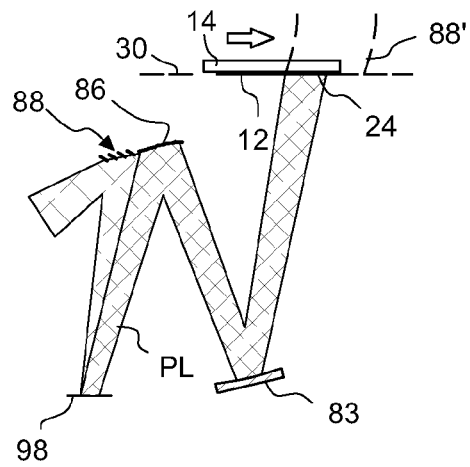

While the mask 14 advances further into the object field 88' in the course of the scanning process, in the regions 88 progressively and synchronously further rows of mirror facets 86 are transferred from the inactive position to the active position. In this way, the extent of the illumination field 24 in the scanning direction is enlarged, as illustrated by FIG. 11c. The enlargement takes place here in each case abruptly by a width that is likewise equal to the width of the image of an individual mirror facet 86.

Figure 11D:
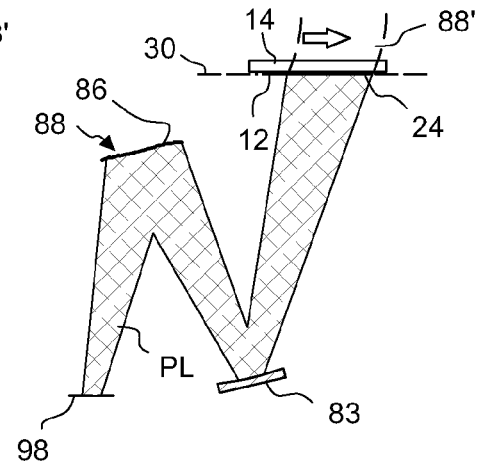
Figure 11E:
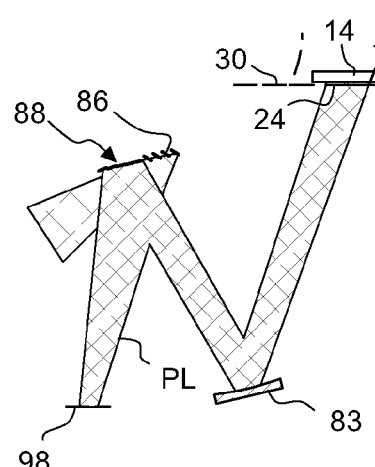
Figure 11F:
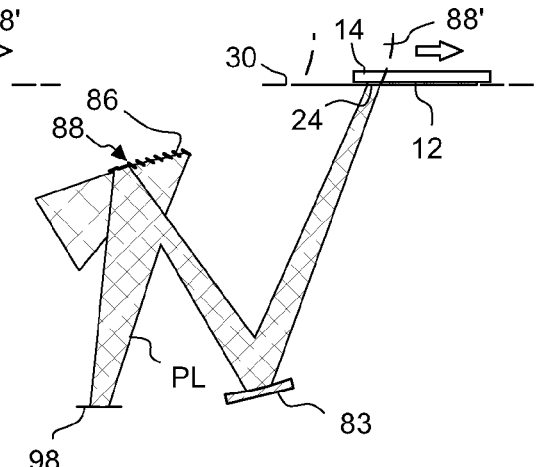

FIG. 11d illustrates the conditions at a later point in time, at which all mirror facets 86 are in an active position. The illumination field 24 now has its maximum size and is therefore identical to the object field 88'. This size of the illumination field 24 is maintained until the structures 12 at the rear end of the mask 14 reach the illumination field 24. Mirror facets 86 in all regions 88 are then transferred from their active position to the inactive position in order in this way to reduce the dimensions of the illumination field 24 along the scanning direction A1. Consequently, the rear end of the illumination field 24 concomitantly moves with the rear end of the region provided with structures 12 on the mask 14, as illustrated by FIGS. 11e and 11f. If there is no longer a structure 12 situated within the object field 88', all mirror facets 86 are again in the inactive position, as is shown in FIG. 11a.

Figure 12A:
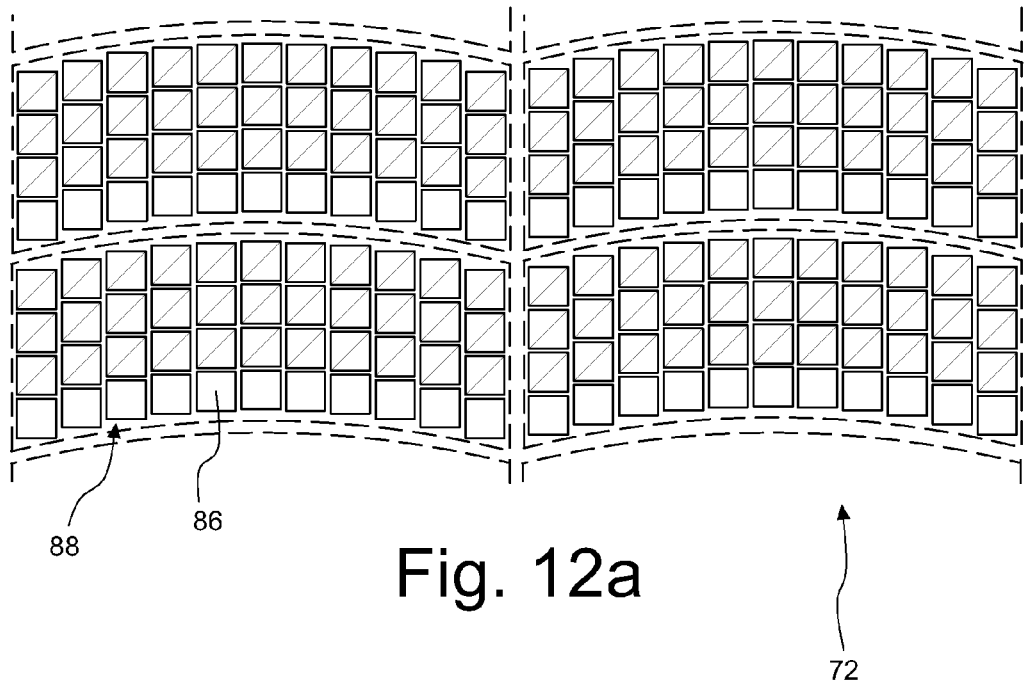
FIGS. 12*a* and 12*b* show an enlarged plan view of a part of the field facet mirror at two different points in time during the scanning process.
Figure 12B:
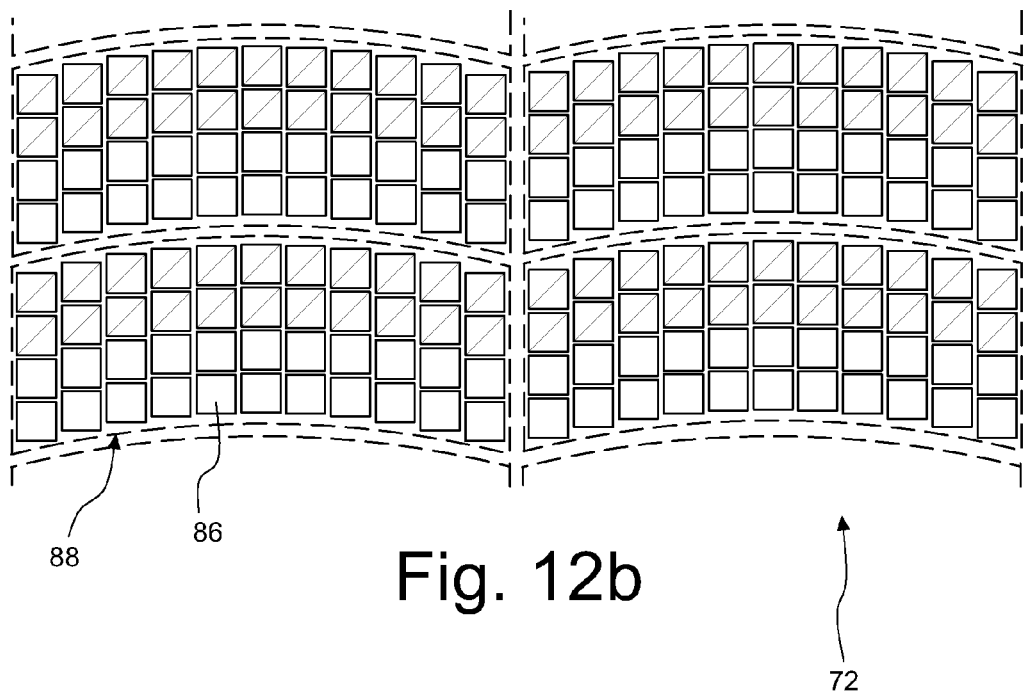

FIGS. 12A and 12B show in plan view an excerpt from the field facet mirror 72 shown in FIG. 4 at two different points in time during the scanning process. At the point in time shown in FIG. 12a, the respective lower row of mirror facets 86 in the regions 88 is an active position, while all the remaining mirror facets 86 are in the inactive position. As a result, the illumination field 24 is formed the narrow strip which is shown in FIG. 10 and which is illuminated at the beginning of the scanning process in the object field 88' (cf. FIG. 11b).

When the mask 14 advances further, in all regions 88 the respective adjacent row of mirror facets 86 are transferred from their inactive position into an active position, as is shown by FIG. 12b. In this way, the illumination field 24 is enlarged increasingly and in a step-by-step manner along the scanning direction. Upon the mask 14 being removed from the object field 88' gradually from the bottom the rows of mirror facets 86 are converted again from their active position to the inactive position.

The mirror facets 86 of the field facet mirror 72 are controlled by a control device 104 shown in FIG. 2, the control device, for its part, being signal-connected to a superordinate central controller 106 of the projection exposure apparatus 10. In this case, the mirror facets 86 are controlled in a manner dependent on the movement position of the moving device 102 which is detected with high accuracy by a measuring system (not illustrated).

As has already been mentioned above, the size of the illumination field is varied in steps, since it is only ever possible to adjust whole series of mirror facets 86 between an active position and an inactive position. Since, on the other hand, the mask 14 is moved continuously, it could happen that projection light PL is momentarily incident on non-structured regions of the mask 14 and inadvertently contributes to the exposure of the light-sensitive layer 16. In order to prevent this, the mask 14 carries a respective absorbent layer 108a and 108b in the scanning direction A1 in front of and behind the structures 12 to be imaged, as is shown in FIG. 1.

Figure 13A:
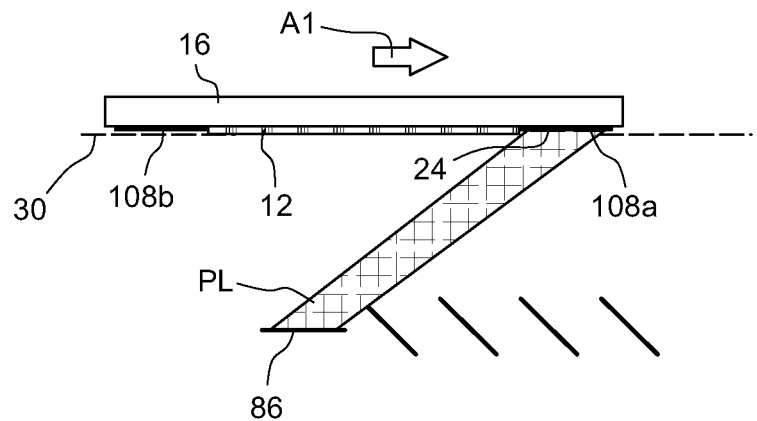
FIGS. 13*a* to 13*c* show a schematic illustration of the conditions during the illumination of the mask at three different points in time during the scanning process.
Figure 13B:
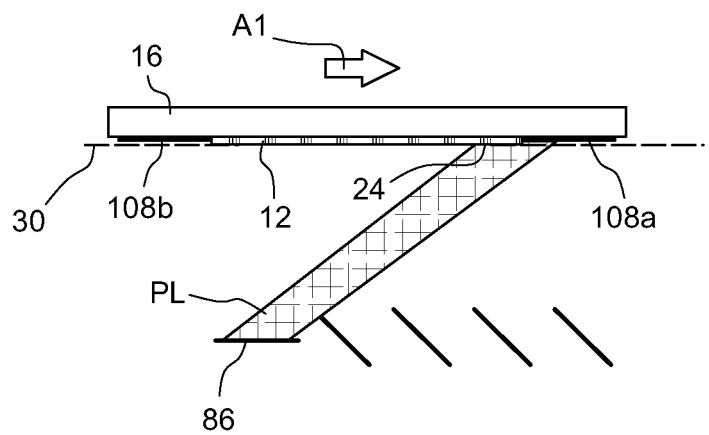
Figure 13C:
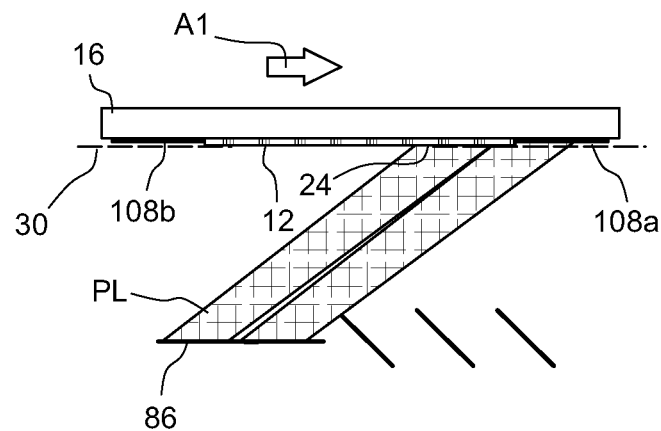

FIGS. 13a to 13c illustrate this in an illustration depicted even more schematically than FIGS. 11a to 11f. In this case, FIG. 13a shows the conditions directly before the structures 12 enter into the object field 88'. At this point in time, a first row of mirror facets 86 is already in an active position, as a result of which projection light PL is directed onto the object field 88' and illuminates a narrow illumination field 24 there. The absorbent layer 108a arranged in the scanning direction A1 in front of the structures 12 on the mask 14 completely absorbs the projection light PL illuminating the illumination field, however, and thus prevents projection light PL from inadvertently being reflected by the mask 14 and contributing to the exposure of the light-sensitive layer 16. Therefore, the width of the absorbent layer 108b along the scanning direction A1 must correspond at least to the width of an illumination field which is illuminated by an individual row of mirror facets 86 in the object field 88'.

When the mask 14 advances further along the scanning direction A1, the structures 12 situated at the front in the scanning direction gradually pass into the illumination field 24, as is shown by FIG. 13b.

Shortly before the end of the structures 12 that is situated at the front in the scanning direction A1 reaches the front end of the illumination field 24, in all regions 88 in each case the next row of mirror facets 86 is transferred from the inactive position to an active position, as is shown by FIG. 13c. These next rows of mirror facets 86 also firstly illuminate only the front absorbent layer 108a on the mask 14. As the mask 14 advances further along the scanning direction A1, however, the structures 12 on the mask 14 also pass into that part of the illumination field 24 which is illuminated by the mirror facets 86 transferred last to an active position.

These consideration correspondingly apply upon the structures 12 being removed from the object field 24. The absorbent layer 108b situated behind the structures 12 in the scanning direction A1 then absorbs the rear strip-shaped part of the illumination field 24.

4. Important Method Steps

Figure 14:
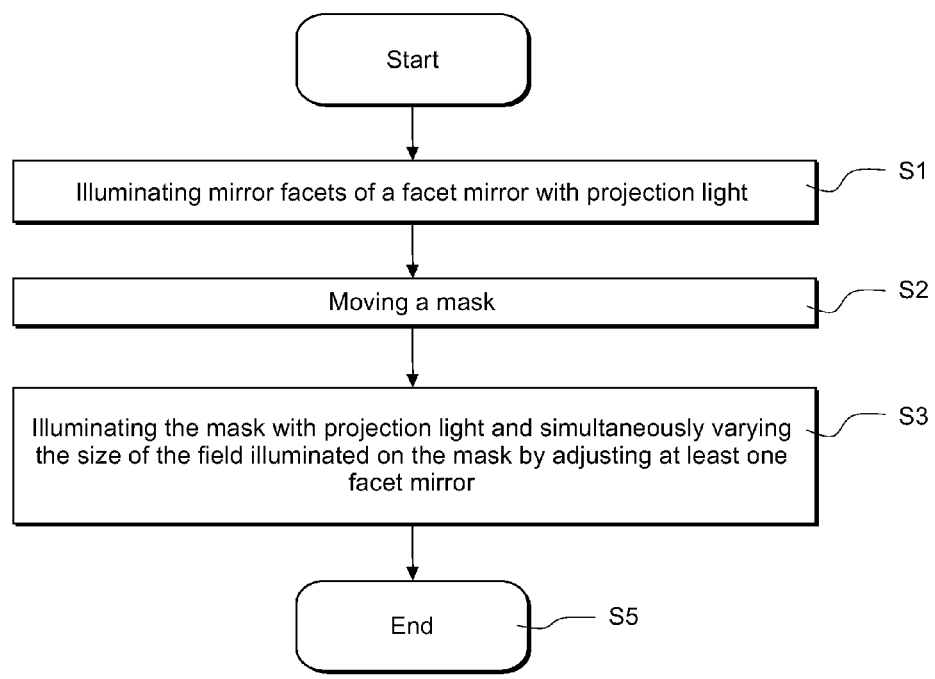
FIG. 14 shows a flow chart for elucidating important steps of the method according to the invention.

Important steps of a method according to the invention for operating a microlithographic projection exposure apparatus are summarized below with reference to the flow diagram shown in FIG. 14.

A first step S1 involves illuminating mirror facets 86 of a facet mirror 72 with projection light PL.

A second step S2 involves moving the mask 14.

A third step S3 involves illuminating the mask 14 with projection light PL, while simultaneously varying the size of the illumination field 24 illuminated on the mask by adjusting at least one facet mirror 86.

5. Important Aspects of the Invention

The following sentences summarize important aspects of the present invention:

1. Method for operating a microlithographic projection exposure apparatus comprising the following steps:
   a) illuminating a facet mirror (72) with projection light (PL) having a center wavelength of between 5 nm and 30 nm, wherein
      the facet mirror (72) comprises a plurality of adjustable mirror facets (86), and wherein
      groups of adjacent mirror facets (86) form regions (88) which are imaged by an optical unit (83, 76, 78, 80) onto an object plane (30) of a projection objective (20) of the projection exposure apparatus (10) in such a way that in the object plane (30) the images of the regions (88) are superimposed in an object field (88');
   b) illuminating an illumination field (24) with projection light (PL), wherein the illumination field (24) is identical to the object field (88') or to a part thereof;
   c) moving a mask (16), containing structures (12) to be imaged, in the object plane (30) of the projection objective (26) in such a way that the illumination field (24) scans over the mask (16);
   d) during step c) varying the size of the illumination field (24) by adjusting at least one mirror facet (86).

2. Method according to sentence 1, wherein in step c) the at least one mirror facet (86) is transferred from an inactive position to an active position, or vice versa, wherein
   the at least one mirror facet (86) in the active position directs projection light (PL) onto the object field (30), and
   the at least one mirror facet (86) in the inactive position cannot direct projection light (PL) onto the object field (30).

3. Method according to sentence 2, wherein the at least one mirror facet (86) is transferred from the inactive position to the active position while the mask is moved in step b).

4. Method according to sentence 2 or 3, wherein the at least one mirror facet (86) is moved from the active position to the inactive position while the mask is moved in step b).

5. Method according to any of the preceding sentences, wherein during step b) the size of the illumination field (24) is varied by adjusting a plurality of mirror facets (86) in a plurality of regions (88).

6. Method according to sentence 5, wherein during step b) the size of the illumination field (24) is varied by adjusting the plurality of mirror facets (86) in all regions (88).

7. Method according to sentence 5 or 6, wherein during step b) the size of the illumination field (24) is varied by simultaneously adjusting the plurality of mirror facets (86) in the plurality of regions (88).

8. Method according to any of the preceding sentences, wherein during step b) the illumination field (24) is enlarged by successively adjusting at least one mirror facet (86) until the illumination field (24) has its maximum size.

9. Method according to any of the preceding sentences, wherein the mask (16) is moved along a scanning direction (A1) in step b), and wherein step c) involves varying exclusively the size of the illumination field (24) along the scanning direction (A1).

10. Method according to any of the preceding sentences, wherein the optical unit (83, 76, 78, 80) comprises a further facet mirror (74), which is arranged in a pupil surface.

11. Microlithographic projection exposure apparatus comprising:
 a) a light source (LS), which is designed to generate projection light (PL) having a center wavelength of between 5 nm and 30 nm,
 b) a facet mirror (72), wherein
  the facet mirror (72) comprises a plurality of adjustable mirror facets (86), and wherein
  groups of adjacent mirror facets (86) form regions (88) which are imaged by an optical unit (83, 76, 78, 80) onto an object plane (30) of a projection objective (26) of the projection exposure apparatus (10) in such a way that in the object plane (30) the images (88') of the regions (88) are superimposed in an object field (24),
 c) a moving device (102) configured to move a mask (16), which contains structures (12) to be imaged, in the object plane (30) of the projection objective (26) in such a way that an illumination field (24), which is illuminated by the projection light (PL) and is identical to the object field (88') or to a part thereof, scans over the mask (16),
 d) a control device (104) configured to control the mirror facets (86), wherein the control device (104) is programmed in such a way that during the moving of the mask (16) the size of the illumination field (24) is varied by adjusting at least one mirror facet (86).

12. Projection exposure apparatus according to sentence 11, wherein the at least one mirror facet (86) is transferred from an inactive position to an active position, or vice versa, wherein
 the at least one mirror facet (86) in the active position directs projection light (PL) onto the object field (30), and
 the at least one mirror facet (86) in the inactive position cannot direct projection light (PL) onto the object field (30).

13. Projection exposure apparatus according to sentence 12, wherein the control device (104) is programmed in such a way that the at least one mirror facet (86) is moved from the inactive position to the active position while the mask (16) enters into the illumination field (24).

14. Projection exposure apparatus according to sentence 12 or 13, wherein the control device (104) is programmed in such a way that the at least one mirror facet (86) is moved from the active position to the inactive position while the mask (16) exits from the illumination field (24).

15. Projection exposure apparatus according to any of the preceding sentences, wherein the control device (104) is programmed in such a way that the size of the illumination field (24) is varied by adjusting a plurality of mirror facets (86) in a plurality of regions (88).

16. Projection exposure apparatus according to the sentence 15, wherein the control device (104) is programmed in such a way that the size of the illumination field (24) is varied by adjusting the plurality of facet mirrors in all regions.

17. Projection exposure apparatus according to sentence 15 or 16, wherein the control device (104) is programmed in such a way that that size of the illumination field (24) is varied by simultaneously adjusting the plurality of mirror facets (86) in the plurality of regions (88).

18. Projection exposure apparatus according to any of sentences 11 to 17, wherein the control device (104) is programmed in such a way that the illumination field (24) is enlarged by successively adjusting at least one mirror facet (86) until the illumination field (24) has its maximum size.

19. Projection exposure apparatus according to any of sentences 11 to 18, wherein the mask (16) carries a first and a second absorbent layer (108a, 108b), which both extend case perpendicularly to a scanning direction (A1), along which the mask (16) is moved, across the entire length of the object field (88'), wherein the first absorbent layer (108a) is arranged in the scanning direction in front of and the second absorbent layer (108b) in the scanning direction behind the structures (12) to be imaged.

The invention claimed is:
1. A method of operating a microlithographic projection exposure apparatus, the method comprising:
 illuminating a facet mirror with projection light having, the facet mirror comprising a plurality of adjustable mirror facets, groups of adjacent mirror facets forming regions which are imageable via an optical unit onto an object plane of a projection objective of the projection exposure apparatus so that the images of the regions are superimposed in an object field of the object plane;
 illuminating an illumination field with projection light, the illumination field being identical to at least part of the object field;
 moving a mask in the object plane so that the illumination field scans over structures of the mask; and
 while moving the mask, adjusting at least one mirror facet to vary a size of the illumination field.

2. The method of claim 1, comprising, while moving the mask, transferring the at least one mirror facet from a first position to a second position, and vice versa, wherein:
 in the first position, the at least one mirror facet directs projection light onto the object field; and
 in the second position, the at least one mirror facet cannot direct projection light onto the object field.

3. The method of claim 1, comprising, while illuminating the illumination field with projection light, adjusting a plurality of mirror facets in a plurality of the regions to vary the size of the illumination field.

4. The method of claim 1, comprising, while illuminating the illumination field with projection light, adjusting the plurality of mirror facets in all the regions to vary the size of the illumination field.

5. The method of claim 1, comprising, while illuminating the illumination field with projection light, simultaneously adjusting the plurality of mirror facets in the plurality of the regions to vary the size of the illumination field.

6. The method of claim 1, comprising, while illuminating the illumination field with projection light, successively adjusting the at least one mirror facet to enlarge the illumination field until the illumination field has its maximum size.

7. The method of claim 1, comprising:
 while illuminating the illumination field with projection light, moving the mask along a scanning direction; and
 while moving the mask in the object plane, varying the size of the illumination field exclusively along the scanning direction.

8. The method of claim 1, comprising using the optical unit to image the regions onto the object plane so that the images of the regions are superimposed in an object field of the object plane.

9. The method of claim 1, wherein the projection light has a center wavelength of between five nanometers and 30 nanometers.

10. The method of claim 1, further comprising using the projection objective to project illuminated structures of the mask onto a light-sensitive material in an image plane of the projection objective.

11. A method of operating a microlithographic projection exposure apparatus comprising an illumination system and a projection objective, the illumination system having an illumination field that at least partially overlaps with an object field of the projection objective, the method comprising:
simultaneously:
illuminating the illumination field with projection light via a facet mirror comprising a plurality of individual mirror facets;
moving a mask in the object plane so that the illumination field scans over structures of the mask; and
adjusting at least one mirror facet to vary a size of the illumination field.

12. The method of claim 11, comprising, while moving the mask, transferring the at least one mirror facet from a first position to a second position, and vice versa, wherein:
in the first position, the at least one mirror facet directs projection light onto the object field; and
in the second position, the at least one mirror facet cannot direct projection light onto the object field.

13. The method of claim 11, wherein groups of adjacent mirror facets form regions which are imageable via an optical unit onto an object plane of a projection objective of the projection exposure apparatus so that the images of the regions are superimposed in an object field of the object plane, and the method comprises, while illuminating the illumination field, adjusting a plurality of mirror facets in a plurality of regions to vary the size of the illumination field.

14. The method of claim 11, wherein groups of adjacent mirror facets form regions which are imageable via an optical unit onto an object plane of a projection objective of the projection exposure apparatus so that the images of the regions are superimposed in an object field of the object plane, and the method comprises, while illuminating the illumination field, adjusting the plurality of mirror facets in all the regions to vary the size of the illumination field.

15. The method of claim 11, wherein groups of adjacent mirror facets form regions which are imageable via an optical unit onto an object plane of a projection objective of the projection exposure apparatus so that the images of the regions are superimposed in an object field of the object plane, and the method comprises, while illuminating the illumination field, simultaneously adjusting the plurality of mirror facets in the plurality of the regions to vary the size of the illumination field.

16. The method of claim 11, comprising, while illuminating the illumination field, successively adjusting the at least one mirror facet to enlarge the illumination field until the illumination field has its maximum size.

17. The method of claim 11, comprising:
while illuminating the illumination field, moving the mask along a scanning direction; and
while moving the mask in the object plane, varying the size of the illumination field exclusively along the scanning direction.

18. The method of claim 11, wherein groups of adjacent mirror facets form regions which are imageable via an optical unit onto an object plane of a projection objective of the projection exposure apparatus so that the images of the regions are superimposed in an object field of the object plane, and the method comprises using the optical unit to image the regions onto the object plane so that the images of the regions are superimposed in an object field of the object plane.

19. The method of claim 11, wherein the projection light has a center wavelength of between five nanometers and 30 nanometers.

20. The method of claim 11, further comprising using the projection objective to project illuminated structures of the mask onto a light-sensitive material in an image plane of the projection objective.

21. The apparatus of claim 11, wherein:
the at least one mirror facet is transferable between a first position and a second position, and vice-versa;
in the first position, the at least one mirror facet directs projection light onto the object field; and
in the second position, the at least one mirror facet cannot direct projection light onto the object field.

22. The apparatus of claim 11, comprising the object, wherein:
the object comprises a mask comprising structures, a first absorbent layer and a second absorbent layer;
both the first and second absorbent layers extend perpendicular to a scanning direction along which the moving device is configured to move the mask across the entire length of the object field; and
in the scanning direction, the structures are between the first absorbent layer and the second absorbent layer.

23. An apparatus comprising:
a projection objective configured to project an object field of an object plane into an image field;
an illumination system having an illumination field, the illumination system comprising:
a facet mirror comprising a plurality of adjustable mirror facets; and
an optical unit, groups of adjacent mirror facets defining regions which are imageable by the optical unit so that images of the regions are superimposed in the object field; and
a moving device configured to move an object in the object plane so that the object field at least partially overlaps with the illumination field; and
a control device configured to control the mirror facets so that, while the moving device moves the object in the object plane, the control device adjusts at least one mirror facet to vary a size of the illumination field,
the apparatus is a microlithographic projection exposure apparatus.

* * * * *

UNITED STATES PATENT AND TRADEMARK OFFICE
CERTIFICATE OF CORRECTION

| | |
|---|---|
| PATENT NO. | : 9,665,010 B2 |
| APPLICATION NO. | : 14/594670 |
| DATED | : May 30, 2017 |
| INVENTOR(S) | : Markus Deguenther |

It is certified that error appears in the above-identified patent and that said Letters Patent is hereby corrected as shown below:

Column 6, Line 2, delete "☐" and insert -- $\beta$ --.

Column 13, Line 60, delete "that that" and insert -- that the --.

Signed and Sealed this
Fifteenth Day of August, 2017

Joseph Matal
*Performing the Functions and Duties of the
Under Secretary of Commerce for Intellectual Property and
Director of the United States Patent and Trademark Office*